US006633107B1

(12) United States Patent
Calabro'et al.

(10) Patent No.: US 6,633,107 B1
(45) Date of Patent: Oct. 14, 2003

(54) LOW NOISE TRANSFORMER

(75) Inventors: Stefano Calabro', Genoa (IT); Franco Moriconi, Milan (IT)

(73) Assignee: ABB T & D Technology Ltd., Zurig (CH)

( * ) Notice: Subject to any disclaimer, the term of this patent is extended or adjusted under 35 U.S.C. 154(b) by 0 days.

(21) Appl. No.: 09/926,237

(22) PCT Filed: Mar. 9, 2000

(86) PCT No.: PCT/EP00/02210

§ 371 (c)(1), (2), (4) Date: Oct. 12, 2001

(87) PCT Pub. No.: WO00/58978

PCT Pub. Date: Oct. 5, 2000

(30) Foreign Application Priority Data

Mar. 29, 1999 (EP) ........................................... 99200953

(51) Int. Cl.[7] ............................................... H01L 41/08

(52) U.S. Cl. ....................... 310/321; 310/326; 310/328

(58) Field of Search ................................ 310/321, 322, 310/326, 328

(56) References Cited

U.S. PATENT DOCUMENTS 3,766,415 A * 10/1973 Dame et al. ................ 310/328
4,803,393 A * 2/1989 Takahashi .................... 310/328
5,250,868 A * 10/1993 Shirasu ....................... 310/328
5,333,455 A 8/1994 Yoshioka
5,726,617 A 3/1998 Pla et al.
5,770,913 A * 6/1998 Mizzi ......................... 310/328
5,798,600 A * 8/1998 Sager et al. ................ 310/330
6,034,466 A * 3/2000 Blanding et al. ........... 310/328

FOREIGN PATENT DOCUMENTS

GB 897859 5/1962
WO WO 81/01479 5/1981
WO WO 98/55060 12/1998

OTHER PUBLICATIONS

Patent Abstracts of Japan, JP 55–049273, Apr. 9, 1980.

* cited by examiner

*Primary Examiner*—Mark Budd
(74) *Attorney, Agent, or Firm*—Oblon, Spivak, McClelland, Maier & Neustadt, P.C.

(57) ABSTRACT

An electrical transformer including a tank containing transformer fluid, a transformer core and winding subassembly disposed in the transformer fluid within and spaced apart from the tank. An active device, disposed in the transformer fluid within the tank, various the volume of the transformer fluid in order to reduce pressure waves generated by the vibration of the core and winding subassembly during electromagnetic operation. The active device includes at least a cell having a main body and a corrugated membrane connected to the main body in order to realize a sealed container able to maintain a low pressure atmosphere inside, and an actuator placed inside the sealed container and solidly connected to the corrugated membrane.

20 Claims, 3 Drawing Sheets

LOW NOISE TRANSFORMER

BACKGROUND OF THE INVENTION

1. Field of the Invention

The present invention generally relates to electrical transformers and more particularly to electrical transformers equipped with means having particular structure and geometry for obtaining low noise levels.

It is well known that electrical transformers generally comprise a tank containing a transformer fluid (i.e. mineral oil), a transformer core and a winding subassembly. The transformer core and winding subassembly are generally placed in the transformer fluid and are spaced apart from the tank of the transformer.

2. Discussion of the Background

It is also well known that noise from transformers is a problem for utility industries or companies, especially when the transformer is installed in urban areas.

The people skilled in the art know that noise in transformers is generated by vibration of the core and winding subassembly during electromagnetic operation and by cooling ventilators used for extracting heat, generated during electromagnetic operation, from the tank to the surrounding atmosphere. While noise from cooling ventilators can be effectively reduced by designing lower speed and larger diameter ventilators equipped with low noise blades, the reduction of the noise from the core and winding subassembly vibration is still a problem, given the fact that solutions known in the state of the art are affected by several drawbacks.

Most of the conventional approaches of the state of the art are oriented to consider passive solutions, for reducing the core noise.

A known approach is to add mass to the transformer core in order to avoid core vibration. Unfortunately, this approach leads to transformers having quite larger core sectional area, with significant increase of weight and costs.

Other approaches consider the use of passive devices inside the transformer tank. These devices are constituted by stacks of layers that are made of materials having elastic properties (i.e. rubber). Being placed inside the transformer tank, they act as damping elements adsorbing transformer fluid pressure waves generated by the core and winding subassembly vibration. The main drawback of this approach is due to the fact that these devices can be designed only for adsorbing fluid pressure waves having a certain amplitude and frequency. If a variation of the frequency and the amplitude of such pressure waves occurs, for example due to changed operational conditions of the transformer, the damping action of these devices may not be effective.

The use of active devices for noise reduction is disclosed, for example, in the U.S. Pat. No. 5,726,617.

In the mentioned patent, the use of dynamic-pressure varying devices, placed inside the transformer tank, is considered. Said means, constituted for example by hydraulic actuators or pumps or other similar devices, vary dynamically the pressure of the transformer fluid in order to reduce the pressure waves generated by the operating core and winding subassembly. An active damping device, placed between the transformer tank and the transformer core and winding subassembly is also disclosed. Its function is to damp actively the vibrations of the core and winding subassembly. Vibration sensors and a controller of the mentioned active devices are placed inside or outside the tank.

The solution described in the mentioned patent, appears, however, of difficult implementation, given the fact that no particular attention is provided to the structure of the mentioned active devices. Actually, a significant amount of energy is required for actuating hydraulic actuators or pumps or similar devices. Moreover due to the not negligible size of such devices, only a small number of them can be placed inside the tank. This fact implies a noise cancellation, which is certainly not optimal, being dependent on the particular position of the dynamic-pressure varying devices. In addition, complicated assembling operations are evidently required for mounting said hydraulic actuators and/or similar devices. Complicated assembling operations are also required for mounting said damping devices placed between the core and the tank of the transformer. This fact further increases the manufacturing costs.

SUMMARY OF THE INVENTION

It is an object of the present invention to provide an electrical transformer able to overcome the above mentioned problems, in particular without having any significant increase of costs for manufacturing or assembling devices able to cancel the noise from core and winding subassembly.

A further object of the present invention is to provide an electrical transformer which uses, for reducing the noise generated by the core and winding subassembly, a plurality of active devices that are able to vary the transformer fluid volume inside the transformer tank and are very simple to be placed inside the inner surface of the tank.

An other object of the present invention is to provide an electrical transformer comprising a plurality of active devices, which can be easily controlled depending on the operating conditions of the transformer.

In order to achieve these objects and others that will become apparent hereinafter, it is provided an electrical transformer, according to the present invention, which comprises:

- a tank containing transformer fluid;
- a transformer core and winding subassembly disposed in said transformer fluid within and spaced apart from said tank;
- active means for varying the volume of said transformer fluid in order to reduce pressure waves generated by the vibration of said core and winding subassembly during electromagnetic operation, said active means being disposed in said transformer fluid within said tank.

The transformer, according to the present invention, is characterised in that said active means comprise at least a cell having:

- a main body and a corrugated membrane operatively connected to said main body in order to realise a sealed container able to maintain a low pressure atmosphere inside;
- actuating means placed inside said sealed container and solidly connected to said corrugated membrane.

BRIEF DESCRIPTION OF THE DRAWINGS

The present invention will now described in more detail with reference to a number of embodiments in accordance to the invention which are given by way of example and which are shown in the accompanying drawings in which.

DESCRIPTION OF THE PREFERRED EMBODIMENTS

Figure 1:
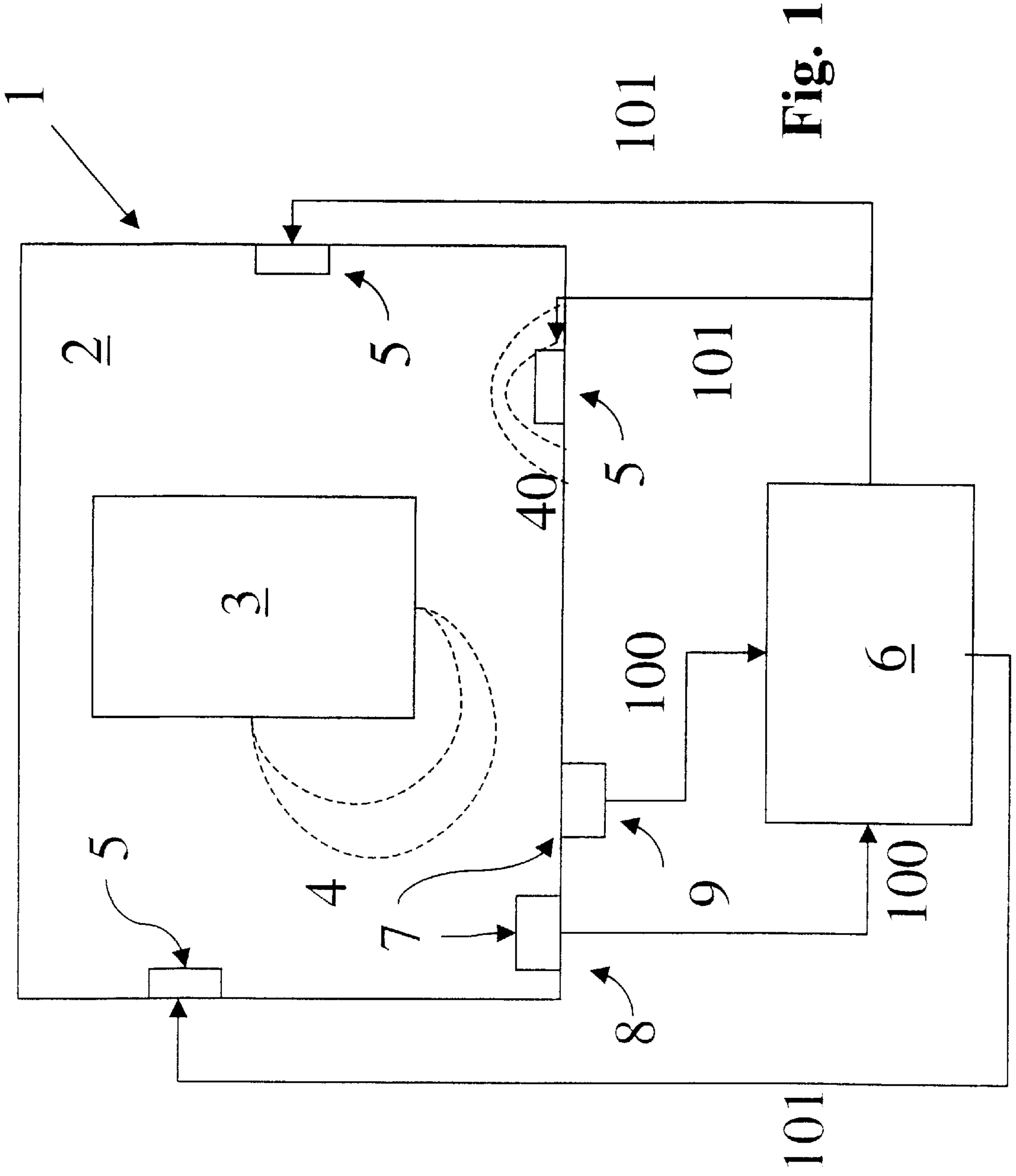
FIG. 1 is a schematic view of an embodiment of an electrical transformer according to the present invention.

Referring to FIG. 1, a schematic view of an embodiment of an electrical transformer according to the present invention is represented.

The transformer according to the present invention comprises a tank I containing transformer fluid 2, such as mineral oil. A transformer core and winding subassembly, schematically represented by the reference number 3, are disposed in said transformer fluid, within and spaced apart from said tank;

As schematically represented in FIG. 1, pressure waves 4 are generated by the vibration of the core and winding subassembly 2 during electromagnetic operation of the transformer. Active means comprising at least a cell 5 are provided for regulating the volume of the transformer fluid 2 in order to reduce pressure waves 4.

Figure 2:
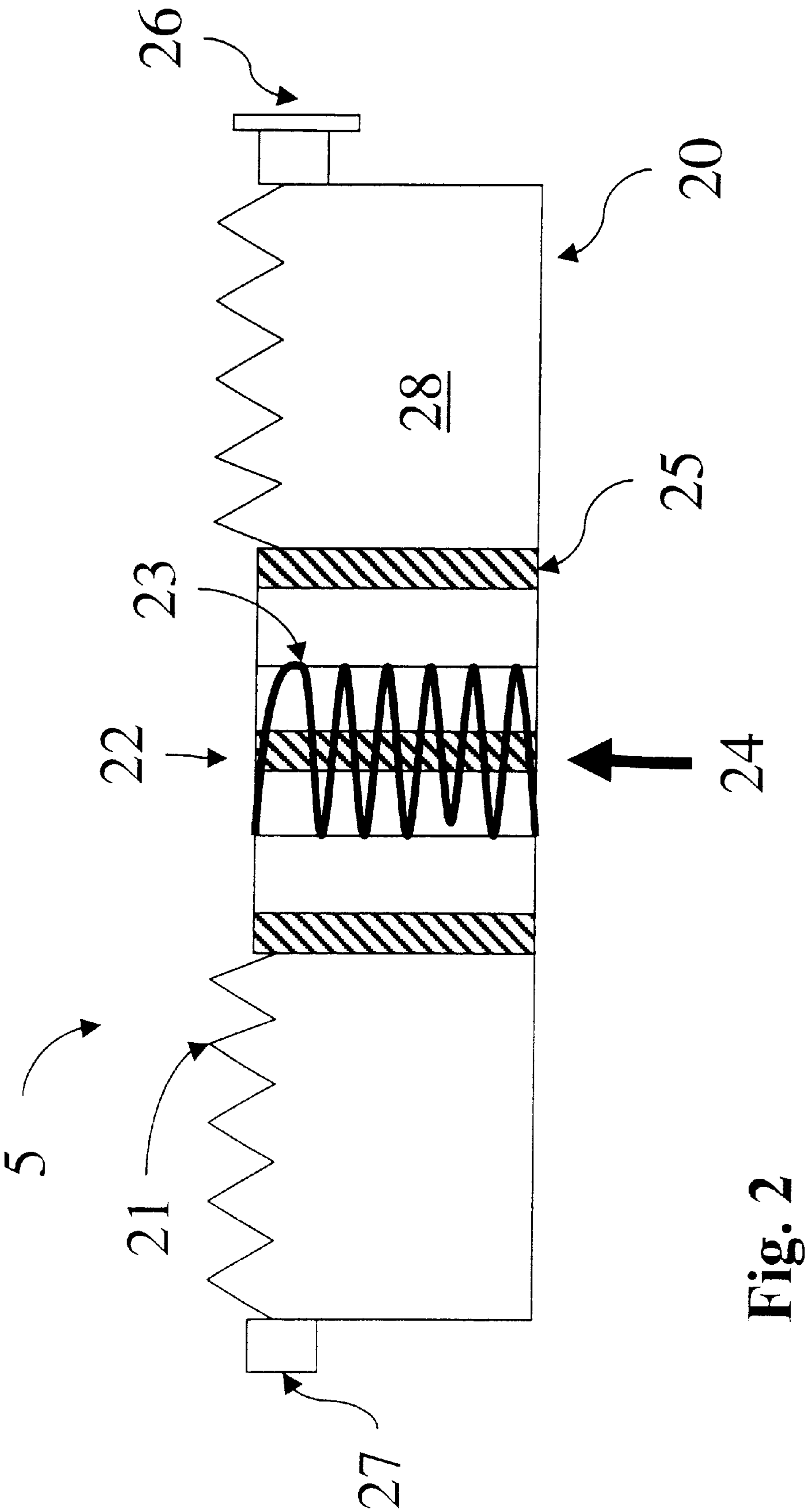
FIG. 2 is a sectional view of an embodiment of an active cell comprised in an electrical transformer according to the present invention.
Figure 3:
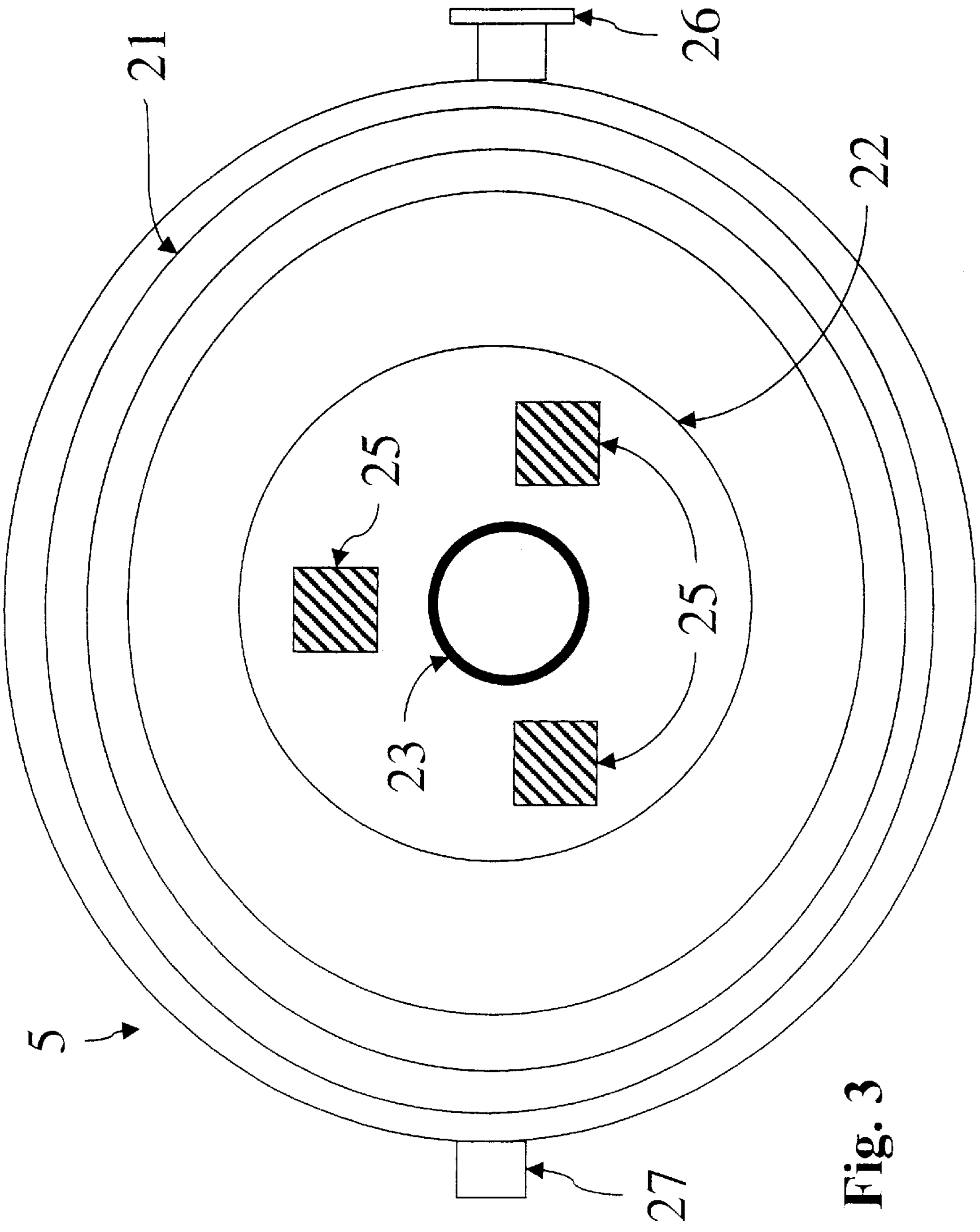
FIG. 3 is an upper view of an embodiment of an active cell comprised in an electrical transformer according to the present invention.

Referring to FIGS. 2 and 3, two different schematic views of a possible structure of a cell 5 are presented.

A cell 5 is structured as a main body 20 having a corrugated membrane 21 operatively connected so as to realise a sealed container. The shape and the number of corrugations for the membrane 21 can be easily designed, according to the needs, by the skilled artisan. Preferably, the main body 20 and the membrane 21 are made of stainless steel and can be welded at the edges.

In an alternative embodiment, every cell 5 can provided with elastic means 23, preferably a soft spring, operatively connected between the main body 20 and the corrugated membrane 21, preferably on the central area 22 of the cell 5. Elastic means 23 have the function of keeping the central area 22 parallel to the plane of the main body 20.

Actuating means 24 are provided inside the cell 5. They are solidly connected to the corrugated membrane 21 and preferably placed close to the central area 22. In a preferred embodiment, illustrated in FIGS. 2 and 3, actuating means 24 are realised with a plurality of piezoelectric stack elements 25. Advantageously, a cell 5 is also equipped with a valve 26, necessary for forcing internally a low pressure atmosphere 28 (an indicative value can be 0.1 bar) and with an electrical connection 27, necessary for providing driving signals to the actuating means 24.

Low pressure atmosphere causes the partial quenching of the corrugated 15 membrane 21 onto the main body 20. The complete quench of the membrane 21 is prevented by the presence of the actuating means 24. Advantageously a plurality of cells 5 can be placed inside the tank 1 and connected to controlling means 6 placed outside the tank 1. The layout of the active cells inside the tank can be easily chosen and optimised by the skilled artisan in order to obtain the most effective cancellation of the pressure waves 4. Detection means 7 for detecting pressure waves 4 are also provided. They comprise (FIG. 1) one or more transducers that can be, for example, pressure transducers 8 placed inside the tank or, alternatively, vibration transducers 9, placed outside the tank 1, for detecting the vibrations of the tank 1 generated by the pressure waves 4. The detection means 7 are connected to the controlling means 6. The connection can preferably of the electrical type, but the meaning of the term "connection" should be intended extensively. So other kinds of connections, such as wireless connections (such as for example through radio communication) or cabled connections (such as for example through optical cables) can be provided.

In a preferred embodiment, controlling means 6 comprise a feedback controller, such as a programmed digital computer.

Referring now to all the mentioned figures, the operation of reducing transformer noise is described.

Pressure waves 4 are detected by detection means 7 which transmit input signals indicative of the amplitude and frequency of such pressure waves 4, to the controlling means 6.

Using appropriate software programs, the controlling means 6 analyse the input signals 100 and, correspondely transmit output signals 101 for driving the actuating means 24 comprised in each cell 5.

Also the connection between the controlling means 6 and the actuating means 24 should be intended in an extensive way, as described above.

Actuating means 24 actuate the corrugate membrane 21 forcing its vibration which generates pressure waves, indicated by reference number 40 in FIG. 1, able to change the volume of the transformer fluid. Such fluid volume changes, proportional to the amplitude and frequency of pressure waves 4, are very effective in core and winding subassembly noise reducing.

If operating conditions of the transformer change, also the vibration mode of the membrane 21 changes accordingly, thanks to the action of the controlling means 6 which always operate for minimising the magnitude of the pressure waves 4. As mentioned, a plurality of cells can be placed inside the transformer tank 1, considering the most appropriate layout. In a preferred embodiment of the present invention, different groups of cells, corresponding to different locations of the tank, can be driven independently. In practice, each group of cells can be driven in closed relation to the amplitude and frequency of the pressure waves that are affecting the tank area where the group is located, at a certain instant. This functioning mode improves very effectively the transformer noise cancellation.

The present invention has proven to be of relatively easy and low cost realisation. Actually, every cell 5 is characterised by a structure very simple to manufacture and having very low size. Due to the use of piezoelectric elements, as actuating means 24, every cell has proven to be of easy control either singularly or in parallel with other cells. This fact implies that a relatively large number of cells can be used. The use of a large amount of cells is also favoured by the relatively low voltage signals that can be used for driving the actuating means 24 of each cells 5.

The foregoing description of preferred embodiments of the present invention has been presented for purposes of illustration. It is not intended to be exhaustive or to limit the invention to the precise form disclosed and obviously many modifications and variations are possible in light of the above teaching.

In practice many variations may suggest themselves to those skilled in the art within the scope of the invention disclosed herein.

We claim:

1. An electrical transformer comprising:

a tank containing transformer fluid;

a transformer core and winding subassembly disposed in said transformer fluid within and spaced apart from said tank; and active means for varying a volume of said transformer fluid in order to reduce pressure waves generated by a vibration of said core and winding subassembly during electromagnetic operation, said active means being disposed in said transformer fluid within said tank, wherein said active means comprise at least a cell having:

a main body and a corrugated membrane operatively connected to said main body in order to realize a sealed container able to maintain a low pressure atmosphere inside said container, and actuating means placed inside said sealed container and solidly connected to said corrugated membrane for vibrating said corrugated membrane to generate pressure waves to change the volume of said transformer fluid in proportion to an amplitude and frequency of the pressure waves generated by the vibration of said core and winding assembly.

2. An electrical transformer as in claim 1, further comprising:

elastic means placed inside said cell, operatively connecting said corrugated membrane and said main body.

3. An electrical transformer as in claim 1, wherein said actuating means comprise one or more piezoelectric stack elements.

4. An electrical transformer as in claim 1, wherein said actuating means are connected to controlling means placed outside said tank.

5. An electrical transformer as in claim 4, wherein said controlling means are connected to detection means for detecting pressure waves generated by the vibration of said core and winding subassembly during electromagnetic operation and transmitting a signal indicative of the amplitude and frequency of said pressure waves to said controlling means.

6. An electrical transformer as in claim 5, wherein said detection means are placed inside the tank of said transformer.

7. An electrical transformer as in claim 5, wherein said detection means are placed outside the tank of said transformer.

8. An electrical transformer as in claim 7, wherein said detection means comprise one or more transducers for detecting the vibrations of said tank generated by said pressure waves.

9. An electrical transformer as in claim 6, wherein said detection means comprise one or more pressure transducers.

10. A method for reducing pressure waves generated by a vibration of a core and winding subassembly during electromagnetic operation of an electrical transformer, the transformer having a tank containing transformer fluid, the transformer core and winding subassembly disposed in said transformer fluid within and spaced apart from said tank, and active means for varying a volume of said transformer fluid in order to reduce pressure waves generated by the vibration of said core and winding subassembly during electromagnetic operation, said active means being disposed in said transformer fluid within said tank, said active means including at least a cell having a main body and a corrugated membrane operatively connected to said main body in order to realize a sealed container for maintaining a low pressure atmosphere inside said container, and including actuating means placed inside said sealed container and solidly connected to said corrugated membrane for vibrating said corrugated membrane to generate pressure waves to change the volume of said transformer fluid, said method comprising:

detecting pressure waves generated by the vibration of said core and winding subassembly of said electrical transformer during electromagnetic operation;

transmitting signals, indicative of an amplitude and frequency of said pressure waves, to a controlling means;

analyzing said signals transmitted by said detection means and transmitting signals for driving said actuating means comprised in each of said cells; and generating, though the vibration of the corrugated membrane of each of said cells, transformer fluid pressure waves, varying in amplitude and frequency in proportion to an amplitude and frequency of the pressure waves generated by the vibration of said core and winding assembly, able to regulate the volume of said transformer fluid.

11. An active device, for regulating a volume of a fluid in which a device is disposed, through a generation of fluid pressure waves varying in amplitude and frequency, said device comprising:

a main body and a corrugated membrane operatively connected to said main body in order to realize a sealed container able to maintain a low pressure atmosphere inside said container; and actuating means placed inside said sealed container and solidly connected to said corrugated membrane for vibrating said corrugated membrane to generate pressure waves to change the volume of said transformer fluid in proportion to an amplitude and frequency of the pressure waves generated by the vibration of the core and winding assembly.

12. An electrical transformer comprising:

a tank containing transformer fluid;

a transformer core and winding subassembly disposed in said transformer fluid within and spaced apart from said tank; and an active element configured to vary a volume of said transformer fluid in order to reduce pressure waves generated by a vibration of said core and winding subassembly during electromagnetic operation, said active element being disposed in said transformer fluid within said tank, said active element including at least a cell having:

a main body and a corrugated membrane operatively connected to said main body to realize a sealed container configured to maintain a low pressure atmosphere inside said container; and an actuating member placed inside said sealed container and solidly connected to said corrugated membrane and configured to vibrate said corrugated membrane to generate pressure waves to change the volume of said transformer fluid in proportion to an amplitude and frequency of the pressure waves generated by the vibration of said core and winding assembly.

13. An electrical transformer as in claim 12, further comprising:

an elastic member placed inside said cell, operatively connecting said corrugated membrane and said main body.

14. An electrical transformer as in claim 12, wherein said actuating member comprise one or more piezoelectric stack elements.

15. An electrical transformer as in claim 12, wherein said actuating member is connected to a controller placed outside said tank.

16. An electrical transformer as in claim 15, wherein said controller is connected to a detector configured to detect the pressure waves generated by the vibration of said core and winding subassembly during electromagnetic operation and to transmit a signal indicative of the amplitude and frequency of said pressure waves to said controller.

17. An electrical transformer as in claim 16, wherein said detector is placed inside the tank of said transformer.

18. An electrical transformer as in claim 16, wherein detector is placed outside the tank of said transformer.

19. An electrical transformer as in claim 18, wherein said detector comprises one or more transducers configured to detect the vibrations of said tank generated by said pressure waves.

20. An electrical transformer as in claim 17, wherein said detector comprises one or more pressure transducers.

* * * * *